United States Patent
Wang et al.

(10) Patent No.: US 6,383,919 B1
(45) Date of Patent: May 7, 2002

(54) METHOD OF MAKING A DUAL DAMASCENE STRUCTURE WITHOUT MIDDLE STOP LAYER

(75) Inventors: Fei Wang, San Jose; Lynne A. Okada, Sunnyvale; Ramkumar Subramanian, San Jose; Calvin T. Gabriel, Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/778,112

(22) Filed: Feb. 7, 2001

(51) Int. Cl.[7] ............... H01L 21/4763; H01L 21/302
(52) U.S. Cl. ............... 438/638; 438/623; 438/725; 438/738
(58) Field of Search ............... 438/622, 623, 438/627, 629, 635, 636–640, 672, 700, 706, 714, 725, 735, 738

(56) References Cited

U.S. PATENT DOCUMENTS 5,928,967 A * 7/1999 Radens et al. ............ 438/740
6,100,184 A * 8/2000 Zhao et al. ............ 438/638
6,211,061 B1 * 4/2001 Chen et al. ............ 438/622

* cited by examiner

Primary Examiner—John F. Niebling
Assistant Examiner—Ha T. Nguyen

(57) ABSTRACT

An interconnect structure and method of forming the same in which a bottom anti-reflective coating/etch stop layer is deposited over a conductive layer. An organic low k dielectric material is deposited over the BARC/etch stop layer to form a first dielectric layer. The first dielectric layer is etched to form a via in the first dielectric layer. An inorganic low k dielectric material is deposited within the via and over the first dielectric layer to form a second dielectric layer over the via and the first dielectric layer. The re-filled via is simultaneously etched with the second dielectric layer in which a trench is formed. A portion of the trench is directly over the via. The re-opened via and the trench are filled with a conductive material.

17 Claims, 5 Drawing Sheets

METHOD OF MAKING A DUAL DAMASCENE STRUCTURE WITHOUT MIDDLE STOP LAYER

RELATED APPLICATIONS

The present application contains subject matter related to subject matter disclosed in co-pending U.S. patent application Ser. No. 09/778,061, filed on Feb. 7, 2001, and Ser. No. 09/788,544, filed on Feb. 21, 2001.

FIELD OF THE INVENTION

The present invention relates to the formation of metal interconnection layers during the manufacture of semiconductor devices, and more particularly to the formation of a damascene structure in a metal interconnect region by a via fill dual damascene technique.

BACKGROUND OF THE INVENTION

The escalating requirements for high-density and performance associated with ultra large-scale integration semiconductor wiring require responsive changes in interconnection technology. Such escalating requirements have been found difficult to satisfy in terms of providing a low RC (resistance capacitance) interconnection pattern, particularly where sub-micron via contacts and trenches have high aspect ratios imposed by miniaturization.

Conventional semiconductor devices typically comprise a semiconductor substrate, normally of doped monocrystalline silicon, and a plurality of sequentially formed dielectric layers and conductive patterns. An integrated circuit is formed containing a plurality of conductive patterns comprising conductive lines separated by inter-wiring spacings. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor chips comprising five or more levels of metalization are becoming more prevalent as device geometries shrink to sub-micron levels.

A conductive plug filling a via hole is typically formed by depositing a dielectric interlayer on a conductive layer comprising at least one conductive pattern, forming an opening in the dielectric layer by conventional photolithographic and etching techniques, and filling the opening with a conductive material, such as tungsten (W). Excess conductive material on the surface of the dielectric layer is typically removed by chemical mechanical polishing (CMP). One such method is known as damascene and basically involves forming an opening in the dielectric interlayer and filling the opening with a metal. Dual damascene techniques involve forming an opening comprising a lower contact or via hole section in communication with an upper trench section, which opening is filled with a conductive material, typically a metal, to simultaneously form a conductive plug and electrical contact with a conductive line.

High-performance microprocessor applications require rapid speed of semiconductor circuitry. The control speed of semiconductor circuitry varies inversely with the resistance and capacitance of the interconnect pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. Thus, the interconnection pattern limits the speed of the integrated circuit. If the interconnection node is routed over a considerable distance, e.g., hundreds of microns or more as in sub-micron technologies, the interconnection capacitance limits the circuit node capacitance loading, and hence, the circuit speed. As integration density increases and feature size decreases in accordance with sub-micron design rules, e.g., a design rule of about 0.1 micron and below, the rejection rate due to integrated circuit speed delays severely limits production throughput and significantly increases manufacturing costs.

In prior technologies, aluminum was used in very large scale integration interconnect metalization. Copper and copper alloys have received considerable attention as a candidate for replacing aluminum in these metalizations. Copper has a lower resistivity than aluminum and improved electrical properties compared to tungsten, making copper a desirable metal for use as a conductive plug as well as conductive wiring.

In the formation of a dual damascene structure in a self-aligned manner, a conductive line and vias that connect the line to conductive elements in a previously formed underlying conductive layer, are simultaneously deposited. A conductive material is deposited into openings (e.g., the via holes and trenches) created in dielectric material that overlays the conductive interconnect layer. Typically, a first layer of dielectric material is deposited over a bottom etch stop layer that covers and protects the conductive interconnect layer. A middle etch stop layer is then deposited over the first dielectric layer. A pattern is then etched into the middle etch stop layer to define the feature, such as a via hole, that will later be etched into the first dielectric layer. Once the middle etch stop layer is patterned, a second dielectric layer is deposited on the middle etch stop layer. The hard mask layer may then be deposited on the second dielectric layer. A desired feature, such as a trench, is etched through the hard mask layer and the second dielectric layer. This etching continues so that the first dielectric layer is etched in the same step as the second dielectric layer. The etching of the two dielectric layers in a single etching step reduces the number of manufacturing steps. The bottom etch stop layer within the via hole, which has protected the conductive material in the conductive interconnect layer, is then removed with a different etchant chemistry. With the via holes now formed in the first dielectric layer and a trench formed in the second dielectric layer, conductive material is simultaneously deposited in the via and the trench in a single deposition step. (If copper is used as the conductive material, a barrier layer is conventionally deposited first to prevent copper diffusion.) The conductive material makes electrically conductive contact with the conductive material in the underlying conductive interconnect layer.

In efforts to improve the operating performance of a chip, low k dielectric materials have been increasingly investigated for use as replacements for dielectric materials with higher k values. Lowering the overall k values of the dielectric layers employed in the metal interconnect layers lowers the RC of the chip and improves its performance. However, low k materials, such as benzocyclobutene (BCB), hydrogen silsesquioxane (HSQ), SiOF, etc., are often more difficult to handle than traditionally employed higher k materials, such as an oxide. For example, inorganic low k dielectric materials are readily damaged by techniques used to remove photoresist materials after the patterning of a layer. Hence, a feature formed in an inorganic low k dielectric layer may be damaged when the photoresist layer used to form the trench is removed. This is of special concern in a dual damascene arrangement if formed in a conventional manner since the inorganic material in the lower, via layer, will be damaged two times. In other words, the inorganic dielectric material in the via layer will be damaged a first time by the removal of photoresist used in forming the via. The same inorganic low k dielectric material in the via layer will also be damaged a second time when the upper layer, the trench layer, is patterned and the photoresist is removed.

Another area for improvement in dual damascene arrangements concerns the use of a middle etch stop layer between the lower and upper dielectric layers. The middle etch stop layer remains after the lower dielectric layer is etched, to form a via, for example. The presence of the middle etch stop layer normally increases the overall k value of the interconnect region. Furthermore, the provision of a middle etch stop layer adds to the number of process steps that must be employed to create the dual damascene structure. For example, a middle etch stop layer deposition step and a middle etch stop layer patterning step are required. When there are multiple interconnect levels, as is common in current manufacturing technology, these additional steps may be repeated at the different interconnect levels. The additional steps increase manufacturing cost and reduce throughput.

There is a need for a method and arrangement for providing a dual damascene interconnect structure which allows low k dielectric layers to be employed in a via layer without risking significant damage to the formed via, while reducing concerns regarding the use of a middle etch stop layer between the lower and upper dielectric layers.

SUMMARY OF THE INVENTION

These and other needs are met by embodiments of the present invention which provide a method of forming an interconnect structure comprising the steps of depositing a diffusion barrier layer over a conductive layer and a first dielectric material over the diffusion barrier layer to form a first dielectric layer. The first dielectric material is an organic dielectric material. The first dielectric layer is etched to form a via in the first dielectric layer. A second dielectric material is then deposited in the via and over the first dielectric layer to form a second dielectric layer over the refilled via and the first dielectric layer. The second dielectric material is an inorganic low k dialectic material. The refilled via is etched simultaneously with a trench in the second dielectric layer.

By depositing a second dielectric material within the via, after the initial formation of the via, the second etching of a via is through newly deposited dielectric material. This has the advantage of reducing the amount of damage sustained in the organic dielectric material in the via layer by a resist removal process. The method of the invention allows low k organic dielectric material to be employed in the first dielectric layer, and inorganic low k dielectric material in the second dielectric layer. The organic low k dielectric material is less sensitive to damage from a photoresist removal process than inorganic low k dielectric material. Hence, by providing the inorganic low k dielectric material on the upper dielectric layer, the inorganic low k dielectric material is subjected to a possibly damaging photoresist removal process only once in a dual damascene method of interconnect formation. This has the effect of increasing structural integrity of the vias and the conductive plugs in the first dielectric layer.

The use of two different types of low k materials, such as organic and inorganic materials, allows etching of one dielectric layer without etching of the other dielectric layer. This obviates the need for the middle etch stop layer. In certain embodiments, the diffusion barrier layer is a BARC underneath the lower dielectric layer that makes the patterning of the photoresist layer on the lower dielectric layer more precise, leading to better formed vias in the lower dielectric layer than would otherwise be formed when a patterned etch stop layer over the lower dielectric layer is not used.

The earlier stated needs are met by another embodiment of the present invention which provides a method of forming an interconnect structure comprising forming a diffusion barrier layer on a conductive layer and forming a first dielectric layer on the diffusion barrier layer. The dielectric material in the first dielectric layer is an organic dielectric material. A via is formed in the first dielectric layer. A second dielectric layer is deposited on the first dielectric layer and in the via to refill the via. The dielectric material in the second dielectric layer is inorganic dielectric material. The second dielectric layer and the refilled via are simultaneously etched to form a trench in the second dielectric layer, and a via in the first dielectric layer. The via and the trench are then filled with conductive material.

The earlier stated needs are also met by another embodiment of the present invention which provides an interconnect structure comprising a diffusion barrier layer on a conductive layer and a first dielectric layer comprising an organic dielectric material on the diffusion barrier layer. A via is provided in the first dielectric layer. A second dielectric layer over the first dielectric layer comprises an inorganic dielectric material, with some of the inorganic dielectric material being in the first dielectric layer within via. A conductive stud is provided within the via, and a conductive line is formed in the second dielectric layer. At least a portion of the width of the conductive stud is located directly beneath the conductive line.

The foregoing and other features, aspects, and advantages of the present invention will become more apparent in the following detail description of the present invention when taken in conjunction with the accompanying drawings.

DETAILED DESCRIPTION OF THE INVENTION

The present invention addresses and solves problems associated with the use of low k dielectric materials in the dielectric layers of a self-aligned dual damascene arrangement in a metal interconnect region of a semiconductor chip. Specifically, the present invention lowers the overall dielectric constant value of the film and prevents extensive damage to the lower dielectric layer of the dual damascene arrangement. This is accomplished, in part, by providing an organic low k dielectric layer as the bottom dielectric layer in the dual damascene arrangement. After forming an initial via in the bottom dielectric layer, and removing the photoresist used to pattern this via, the via is filled again with an inorganic dielectric material that is used to form the second dielectric layer. When the second dielectric layer is etched to form the line or other feature in the second dielectric layer, the filled via is again etched to re-open the via. Hence, the re-opened via will only be exposed a single time to the damaging step of removing the photoresist, which will occur upon the removal of the photoresist employed to pattern the second dielectric layer. The use of two types of low k dielectric materials in the lower and upper dielectric layers, having different etch sensitivities, allows the elimination of an etch stop layer between the dielectric layers. This lowers the overall k value of the interconnect structure and reduces the number of processing steps and the manufacturing costs.

Figure 1:
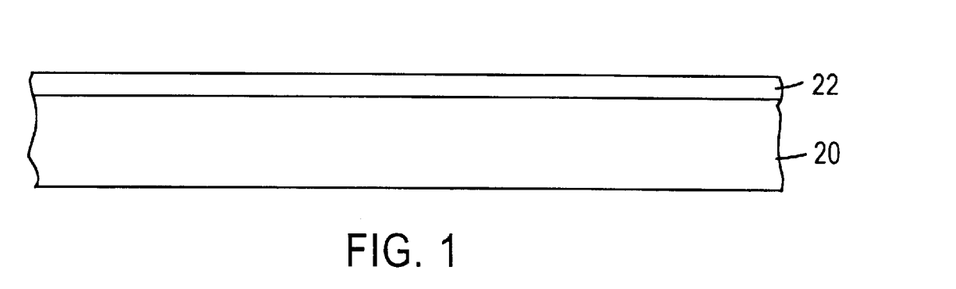
FIG. 1 is a cross-section of a metal interconnect portion of a semiconductor wafer after a first etch stop layer is deposited on an underlying conductive interconnection layer, in accordance with embodiments of the present invention.

FIG. 1 depicts a cross-section of a metal interconnect portion of a chip processed in accordance with embodiments of the present invention, at one stage of the processing. At this stage, a conductive layer 20 has been formed, which may be made of a metal, for example, or other conductive material. In especially preferred embodiments, the conductive metal is copper or a copper alloy, due to the earlier stated advantages of copper over other metals. A first etch stop layer 22 is formed, by deposition, for example, over the conductive layer 20. The first etch stop layer 22, in certain embodiments, is made of silicon carbide. Other materials may be used for the first etch stop layer 22, such as silicon oxynitride, silicon nitride, etc. A primary purpose of the first etch stop layer at 22 is to protect the conductive material 20 during etching of the overlying dielectric layers. The first etch stop layer 22 also serves as a diffusion barrier. In certain embodiments, another purpose of the first etch stop layer 22 is as an anti-reflective coating (ARC), which improves the formation of the via in the first dielectric layer. Silicon carbide, as one example of an etch stop material, exhibits excellent properties as an ARC, and is therefore particularly suitable for use in the first etch stop layer 22.

Figure 2:
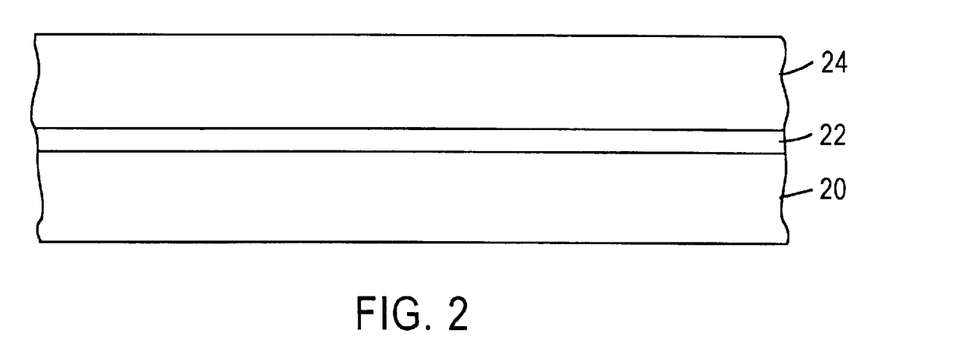
FIG. 2 is a cross-section of the metal interconnect portion of FIG. 1, after a first dielectric layer is formed on the first etch stop layer, in accordance with the embodiments of the present invention.

As shown in FIG. 2, a first dielectric layer 24 is then formed on the first etch stop layer 22. In the present invention, the material forming the first dielectric layer 24 is an organic dielectric material. In particularly preferred embodiments, the organic dielectric material is an organic low k dielectric material. The organic low k dielectric material may be selected from a number of different materials, including SILK, benzocyclobutene, Nautilus (all manufactured by Dow) polyfluorotetraethylene (manufactured by DuPont), FLARE (manufactured by Allied Chemical), etc. For purposes of example, assume that the first dielectric layer 24 is formed to a thickness of between about 1,000 and about 8,000 Å.

Figure 3:
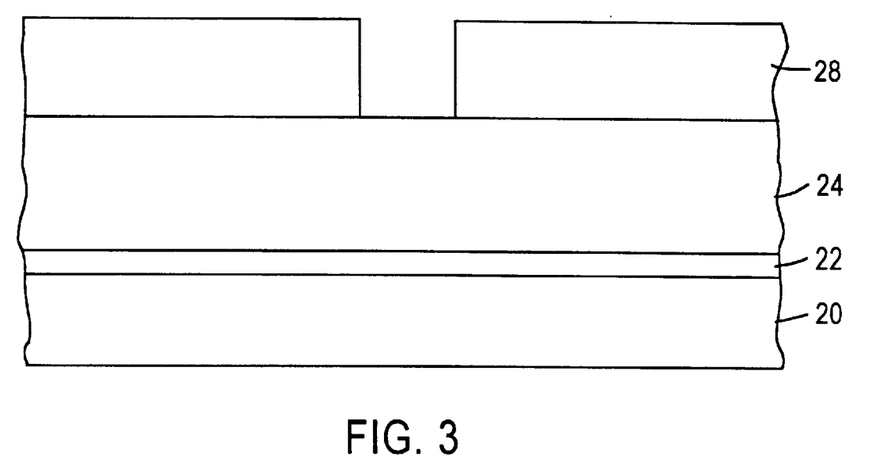
FIG. 3 is a cross-section of the portion of FIG. 2, following the position and patterning of a photoresist layer on the first dielectric layer to define a feature to be etched into the first dielectric layer, in accordance with the embodiments of the present invention.

FIG. 3 is a cross-section of the metal interconnect portion of FIG. 3 following the positioning and patterning of a photoresist layer 28 on the first dielectric layer 24. The pattern created within the photoresist layer 28 defines the feature, such as a via, that will eventually be etched into the first dielectric layer 24. Providing ARC material as the first etch stop layer 22 in certain embodiments helps the resolution of the feature in the photoresist layer 28.

Figure 4:
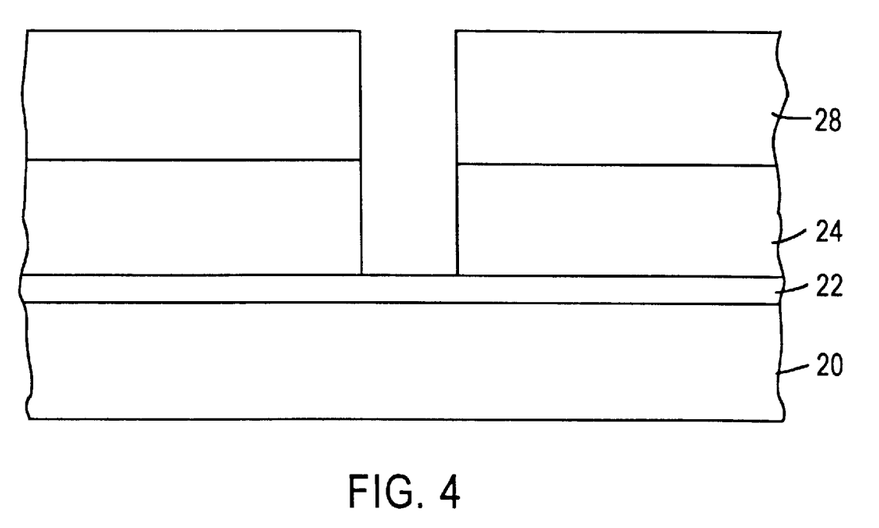
FIG. 4 is a cross-section of the portion of FIG. 3, after the first dielectric layer is etched in accordance with the pattern in the photoresist layer, in accordance with the embodiments of the present invention.

FIG. 4 is a cross-section of the portion of FIG. 3 following the etching of the first dielectric layer 24 in accordance with the embodiments of the present invention. The etchant chemistry employed to etch the organic dielectric material in the first dielectric layer 24 may be $N_2/H_2$, or $O_2/N_2/Ar$, for example. The etchant should be selective such that the material on the first dielectric layer 24 is etched, with the etching stopping at the first etch stop layer 22. At least some of the photoresist layer 28 is depicted in FIG. 4 as remaining on the first dielectric layer 24 following the etching of the via in FIG. 3. However, in certain embodiments of the invention, the etching of the via and the photoresist layer 28 are performed simultaneously, so that all of the photoresist layer 28 is removed when the via is etched. In such embodiments, the structure of FIG. 4 is not produced, and the next structure after FIG. 3 is that of FIG. 5.

Figure 5:
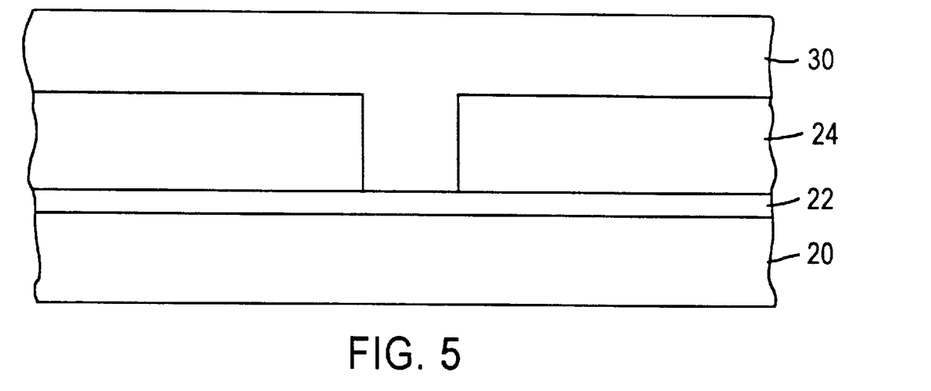
FIG. 5 is a cross-section of the portion of FIG. 4, following removal of the photorest layer on the first dielectric layer, and the formation of a second dielectric layer on the first dielectric layer and the filling of the via in the first dielectric layer.

FIG. 5 is a cross-section of the portion of FIG. 4 (or FIG. 3) following the removal of the photoresist layer 28 and the formation of a second dielectric layer 30 over the first dielectric layer 24. The dielectric material in the second dielectric layer 30 also fills the via that was previously opened in the first dielectric layer 24, as was depicted in FIG. 4. This has the result that the previously opened via, which may have been damaged by the removal of the photoresist layer 28, has been refilled with dielectric material that has not been damaged.

The top surface of the first dielectric layer may be damaged by the photoresist removal process performed in FIG. 5, although organic low k dielectric material is not as sensitive to such processes as inorganic low k dielectric material. In certain embodiments of the invention, the damage is largely prevented by forming a cap layer over the first dielectric layer 24 prior to the patterning and etching of the via. Exemplary materials include silicon oxide, or silicon nitride, although other materials may be used. The cap layer may remain in place, or may be removed. The formation of a cap layer and its removal are not shown in these drawings. The second dielectric layer 30 is formed once the cap layer is removed, in these embodiments.

The dielectric material in the second dielectric layer 30 and in the re-filled via in the first dielectric layer 24 is an inorganic dielectric material in the embodiments of the present invention. In preferred embodiments of the invention, the inorganic dielectric material is a low k dielectric material. An example of an inorganic dielectric material is a silicon oxide, such as $SiO_2$. Examples of inorganic low k dielectric materials include methyl silsesquioxane (MSQ), hydrogen silsesquioxane (HSQ), and fluorinated tetraethyl orthosilicate (FTEOS). The use of a low k dielectric material in the upper, trench layer is advantageous in that reduction of line-to-line capacitance is even more critical than reducing capacitance in the via layer to increase circuit operating speeds. Providing an inorganic material in one of the dielectric layers and an organic material in the other of the dielectric layers enables good etch selectivity between the dielectric layers. When the re-filled via is etched, as described below, the etch selectivity allows the re-filled via to be precisely etched, as only the second dielectric material is etched, and not the surrounding first dielectric material.

The via is re-filled with the same material as in the upper, second dielectric layer 30. It should be appreciated that the use of the same dielectric material in the second dielectric layer 30 and in the re-filled via in the first dielectric layer 24 ensures that a single etchant can be employed to etch both the trench and the re-filled via.

Figure 6:
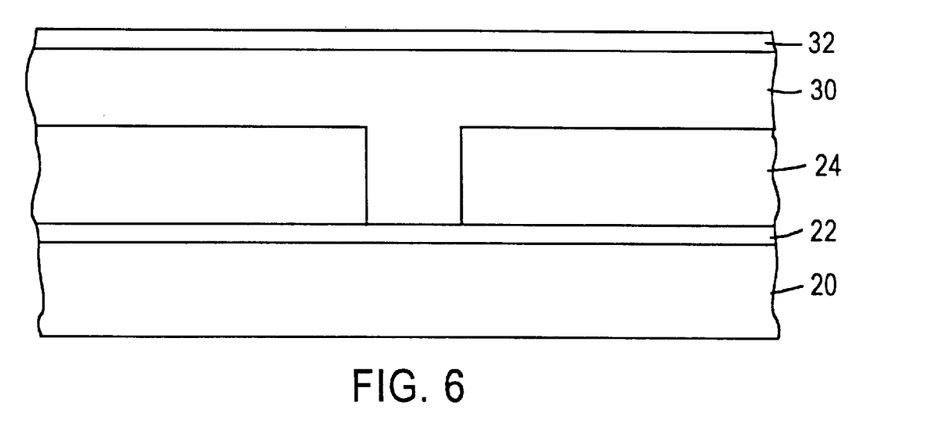
FIG. 6 is a cross-section of the portion of FIG. 5, following the deposition of a hard mask layer on the second dielectric layer, in accordance with the embodiments of the present invention.

In certain embodiments, planarization is not required. In other embodiments, planarization of the second dielectric layer 30 is performed, such as by CMP. In either embodiment, a hard mask layer 32 is deposited on the second dielectric layer 30, as depicted in FIG. 6. The hard mask layer 32 may comprise silicon nitride or silicon oxide, for example, and serves to selectively protect the second dielectric layer 30 during the etching steps.

Figure 7:
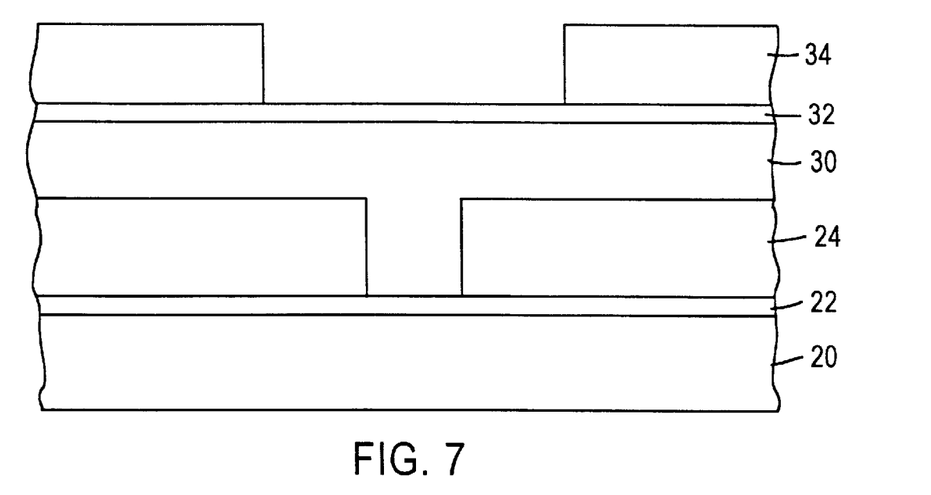
FIG. 7 is a cross-section of the portion of FIG. 6, following the positioning and patterning of a photoresist layer on a second dielectric layer to define a first feature to be etched in the second dielectric layer, in accordance with the embodiments of the present invention.

As shown in FIG. 7, a photoresist layer 34 is then positioned and patterned on the hard mask layer 32. The pattern in the photoresist layer 34 contains a feature that is to be etched into the second dielectric layer 30. The desired feature, such as a trench opening, is created (see FIG. 8) by etching the hard mask layer 32 and the second dielectric layer 30. The etching stops at the first etch stop layer 22. Hence, the etching completely etches out the re-filled via. Since the material surrounding the refilled via is organic dielectric material and the via was re-filled with inorganic dielectric material, the first dielectric layer is not etched in this selective etching process, except for the re-opening of the via. In preferred embodiments of the invention, multiple etching steps are used to create the structure depicted in FIG. 10. These steps include etching the hard mask layer 32, followed by simultaneously etching the second dielectric layer 30 and the re-filled via in the first dielectric layer 24.

Figure 8:
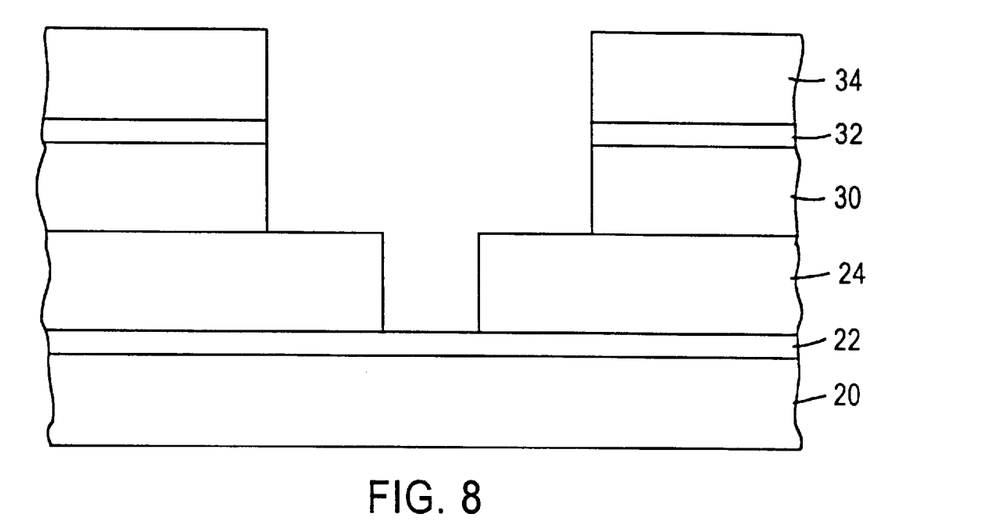
FIG. 8 is a cross-section of the portion of FIG. 7, after etching through the hard mask layer and the second dielectric layer in accordance with the pattern in the photoresist layer to create a first feature in the second dielectric layer, and etching through the re-filled via to define a via in the first dielectric layer, in accordance with the embodiments of the present invention.

As stated earlier, the use of two different types of dielectric materials with different etch sensitivities allows precise formation of the via from the re-filled via. Only the second dielectric material, which is in the re-filled via, will be etched in the first dielectric layer during the etch of the second dielectric layer and the re-filled via. The first dielectric material, which previously filled but now surrounds the re-filled via in the first dielectric layer, is not etched during the re-opening of the via.

A suitable etchant chemistry for etching the nitride hard mask layer 32 is $CHF_3/N_2$. The etchant chemistry employed to etch the inorganic dielectric material in the second dielectric layer 30 and the re-filled via may be $CHF_3/O_2/Ar$, $CF_4$, $C_4F_8$, or $C_2F_6$. These etchants are exemplary only, as a suitable etchant may be employed depending on the particular inorganic dielectric material comprising the second dielectric layer.

Figure 9:
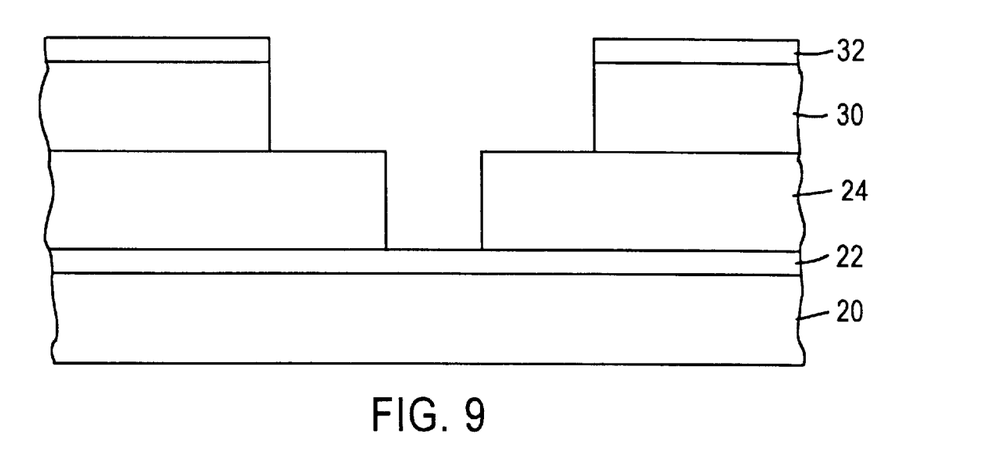
FIG. 9 is a cross-section of the portion of FIG. 8, following removal of the photoresist layer, in accordance with the embodiments of the present invention.

As seen in FIG. 9, the photoresist layer 34 may be removed by an etching or oxygen ashing process. Although the second dielectric layer 30 and the re-opened via are formed from inorganic dielectric material, this material is exposed to only a single photoresist removal process step that could possibly cause damage to the trench or the via that have been formed. This provides an improvement in the structure of the via over processes in which inorganic dielectric material in the via layer is subjected to multiple process steps in which the feature may be damaged.

Figure 10:
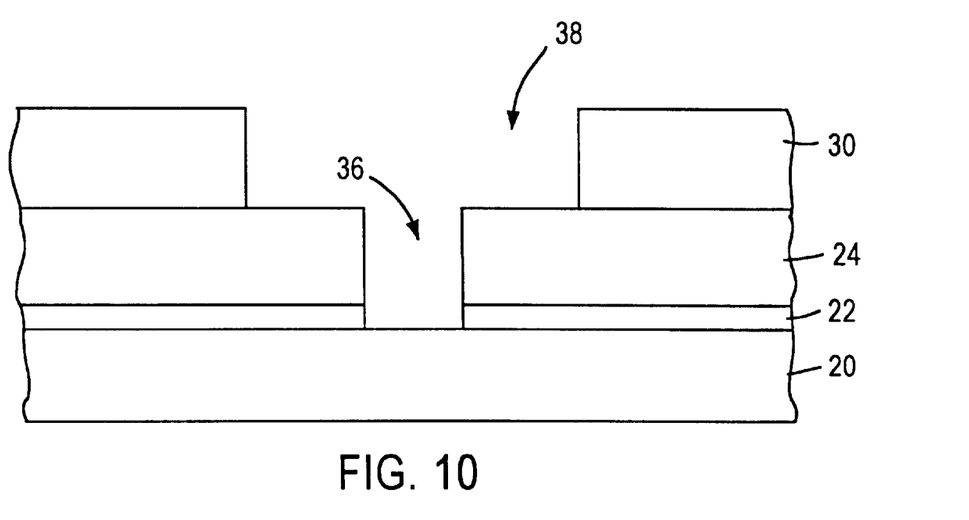
FIG. 10 is a cross-section of the portion of FIG. 9, following etching of the first etch stop layer, in accordance with the embodiments of the present invention.

The first etch stop layer 22 is now etched within the re-opened via that now exists in the first dielectric layer 24, as seen in FIG. 10. This removes the etch stop material covering the conductive material on the conductive layer 20. A suitable etchant to remove the etch stop material, for example silicon carbide, while not adversely affecting the conductive material (e.g., copper), is $CHF_3/N_2$. This etchant chemistry prevents copper oxidation, removes sidewall polymer with $N_2$, and etches the silicon carbide without undercutting the dielectric material in the second dielectric layer 30 or the dielectric material in the first dielectric layer 24. The etching of the first etch stop layer 22 leaves a first opening 36, such as a via hole, and a second opening 38, such as a trench.

Figure 11:
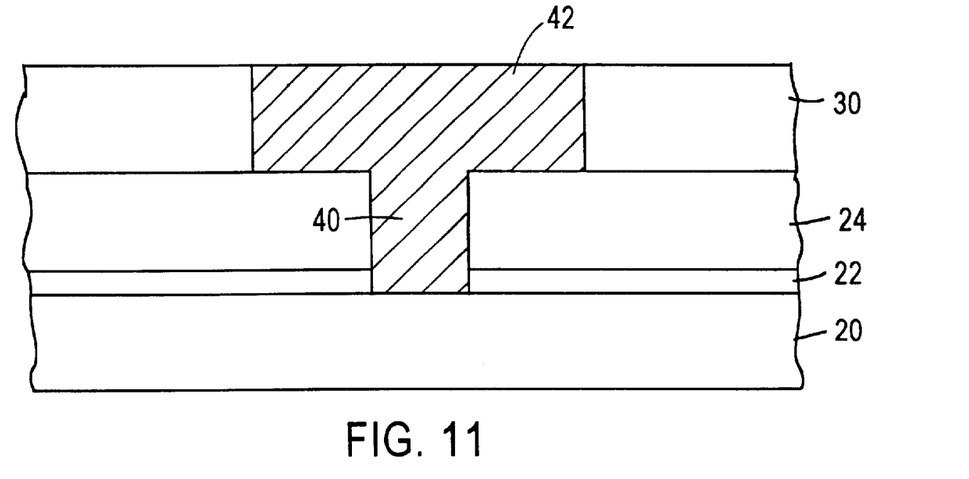
FIG. 11 is a cross-section of the portion of FIG. 10, after the first and second features are filled with a conductive material, in accordance with the embodiments of the present invention.

The via hole 36 and the trench 38 are now filled in a simultaneous deposition step with conductive material, preferably copper in certain embodiments of the present invention. Deposition of a barrier layer, typically employed to prevent copper diffusion, is not depicted in order not to obscure the invention, although one can be provided. Also, in certain embodiments of the invention, barrier layers not needed as certain low k dielectric materials form a self-barrier against copper diffusion. After chemical mechanical planarization (CMP), the dual damascene structure of FIG. 11 is formed with the via (or stud) 40 electrically connecting the underlying conductive layer 20 to the conductive line 42 formed in the trench 38.

The filling of a previously formed via during the position of a second dielectric layer allows the formation of a via that is subjected to only one damaging process, instead of multiple damaging processes, such as photoresist removals. This enhances the integrity of the features formed in the lower dielectric layer, such as a via layer, while allowing the use of inorganic low k dielectric materials in a dual damascene arrangement.

Although the present invention has been described and illustrated in detailed, it is to be clearly understood that the same is by way of illustration and example only and is not to be taken by way of limitation, the scope of the present invention being limited only by the terms of the appended claims.

What is claimed is:

1. A method of forming an interconnect structure, comprising the steps of:

depositing a diffusion barrier layer over a conductive layer;

depositing a first dielectric material over the diffusion barrier layer to form a first dielectric layer, the first dielectric material being an organic dielectric material;

etching the first dielectric layer to form a via hole in the first dielectric layer exposing a portion of the diffusion barrier layer;

depositing a second dielectric material in the via hole and over the first dielectric layer to form a refilled-via and a second dielectric layer over the first dielectric layer, the second dielectric material being an inorganic dielectric material and contacting the first dielectric layer; and simultaneously etching the refilled-via completely and a trench in the second dielectric layer, with at least a portion of the trench being directly over the via hole.

2. The method of claim 1, wherein the organic dielectric material is selected from at least one of Silk, benzocyclobutene, FLARE, Nautilus, and Teflon.

3. The method of claim 2, wherein the inorganic dielectric material is selected from at least one of silicon dioxide, methyl silsesquioxane (MSQ), hydrogen silsesquioxane (HSQ), and fluorine tetraethylorthosilicate (FTEOS).

4. The method of claim 3, wherein the step of etching the first dielectric layer includes etching with $N_2/H_2$ or $O_2/N_2/Ar$.

5. The method of claim 4, wherein the step of simultaneously etching includes etching with $C_4F_8/Ar/CO$ or $CHF_3/CO/Ar$.

6. The method of claim 5, further comprising depositing a conductive material simultaneously in the via hole and the trench.

7. The method of claim 6, wherein the conductive material is copper.

8. The method of claim 2, wherein the step of etching the first dielectric layer includes etching with at least one of $N_2/H_2$ and $O_2/N_2/Ar$.

9. The method of claim 1, wherein the inorganic dielectric material is selected from at least one of silicon dioxide, methyl silsesquioxane (MSQ), hydrogen silsesquioxane (HSQ), and fluorine tetraethylorthosilicate (FTEOS).

10. The method of claim 1, wherein the diffusion barrier layer comprises an anti-reflective coating.

11. A method of forming an interconnect structure comprising:

forming a diffusion barrier layer on a conductive layer;

forming a first dielectric layer on the diffusion barrier layer, dielectric material in the first dielectric layer being an organic dielectric material;

forming a via hole in the first dielectric layer exposing a portion of the diffusion barrier layer;

depositing a second dielectric layer on the first dielectric layer and in the via hole forming a refilled-via, wherein dielectric material in the second dielectric layer is an inorganic dielectric material;

etching the second dielectric layer including in the refilled-via to simultaneously to form a trench and a connected via; and filling the connected via and the trench with a conductive material.

12. The method of claim 11, wherein the organic dielectric material is selected from at least one of SILK, benzocyclobutene, FLARE, Nautilus, and Teflon.

13. The method of claim 12, wherein the inorganic dielectric material is selected from at least one of silicon dioxide, methyl silsesquioxane (MSQ), hydrogen silsesquioxane (HSQ), and fluorine tetraethylorthosilicate (FTEOS).

14. The method of claim 13, wherein the step of forming a via includes etching the organic dielectric material with at least one of $N_2/H_2$ and $O_2/N_2/Ar$.

15. The method of claim 14, wherein the step of etching includes etching with $C_4F_8/Ar/CO$ or $CHF_3/CO/Ar$.

16. The method of claim 15, wherein the conductive material is copper.

17. The method of claim 11, wherein the diffusion barrier layer comprises an anti-reflective coating.

* * * * *